United States Patent [19]
Goto

[11] Patent Number: 5,644,165
[45] Date of Patent: Jul. 1, 1997

[54] SEMICONDUCTOR DEVICE HAVING A P-TYPE OHMIC ELECTRODE STRUCTURE

[75] Inventor: Hideki Goto, Tsuchiura, Japan

[73] Assignee: Mitsubishi Kasei Corporation, Tokyo, Japan

[21] Appl. No.: 606,867

[22] Filed: Feb. 27, 1996

Related U.S. Application Data

[63] Continuation of Ser. No. 2,779, Jan. 14, 1993, abandoned.

[30] Foreign Application Priority Data

Jan. 14, 1992 [JP] Japan ................... 4-005168

[51] Int. Cl.$^6$ ............... H01L 31/0328; H01L 29/22; H01L 23/48; H01L 23/52
[52] U.S. Cl. ............... 257/744; 257/201; 257/614; 257/741
[58] Field of Search ............... 257/42, 82, 201, 257/614, 99, 741, 744

[56] References Cited

U.S. PATENT DOCUMENTS

| | | | |
|---|---|---|---|
| 4,629,820 | 12/1986 | Basol et al. | 136/255 |
| 4,910,154 | 3/1990 | Zanio et al. | 257/744 |
| 5,045,897 | 9/1991 | Ahlgren | 257/99 |
| 5,187,116 | 2/1993 | Kitigawa et al. | 437/105 |
| 5,215,929 | 6/1993 | Okawa et al. | 437/23 |
| 5,293,074 | 3/1994 | Taskar et al. | 257/744 |
| 5,294,833 | 3/1994 | Schetzina | 257/741 |

OTHER PUBLICATIONS

*Applied Physics Letters*, vol. 29, No. 7 (Oct. 1, 1976), New York, US, pp. 433–434; J.S. Best et al.: "HgSe, a Highly Electronegative Stable Metallic Contact for Semiconductor Devices".

*Primary Examiner*—Sara W. Crane
*Assistant Examiner*—Valencia Martin Wallace
*Attorney, Agent, or Firm*—Armstrong, Westerman, Hattori, McLeland & Naughton

[57] ABSTRACT

A p-type ohmic metal electrode for use with a group II–VI semiconductor device. The p-type ohmic metal electrode is made of a group II–IV p-type semiconductor layer having a group II element other than zinc dispersed in that layer disposed on the group II–IV semiconductor device, and a metal electrode layer disposed on the group II–IV semiconductor layer including the group II element other than zinc. Also disclosed is a group II–IV semiconductor device including a p-type group II–IV semiconductor containing zinc and selenium and the above ohmic metal electrode disposed on the group II–IV semiconductor device. Additionally, a group II–IV semiconductor device including a p-type group II–IV semiconductor containing zinc and selenium, a layer of a group II element other than zinc disposed on the group II–IV semiconductor device, and a metal electrode layer disposed on the layer of the group II element other than zinc is disclosed.

4 Claims, 2 Drawing Sheets

SEMICONDUCTOR DEVICE HAVING A P-TYPE OHMIC ELECTRODE STRUCTURE

This application is a continuation application of Ser. No. 08/002,779 filed Jan. 14, 1993, now abandoned.

BACKGROUND OF THE INVENTION

The present invention relates to a semiconductor device, and in particular, to a group II–IV semiconductor device having a p-type ohmic electrode structure which is suitable for the group II–IV semiconductor device.

Currently, blue light emitting diodes (LEDs) or blue laser diodes (LDs) have been made using a plural component group II–IV semiconductor which is higher than a ternary one and which contains zinc and selenium. In particular, with the use of a p-n junction which is formed by using nitrogen as a p-type dopant, suitable light emission can be obtained.

However, there are few metals suitable for use as a p-type ohmic electrode having a low resistance which is also suitable for use with p-type group II–IV compounds. Accordingly, the ohmic resistances of the p-layer side of green to blue light emitting diodes or semiconductor lasers having p-n junctions are extremely high. Accordingly, the majority of the power input into such an LED or LD is consumed in the form of heat, resulting in low efficiency of light emission with respect to input power. Further, the generation of heat can cause the devices such as LEDs or LDs to deteriorate, lowering their reliability. Accordingly, a satisfactory p-type ohmic electrode has been needed to obtain practically usable devices such as blue LEDs or LDs.

An object of the present invention is to provide a p-type ohmic electrode having low electric resistance for a p-type group II–IV semiconductor element containing zinc and selenium.

SUMMARY OF THE INVENTION

The above object is met by an ohmic metal electrode made of a group II–IV semiconductor layer having a group II element other than zinc dispersed in that layer disposed on the group II–IV semiconductor element and a metal electrode layer disposed on the group II–IV semiconductor layer including the group II element other than zinc.

The present invention also encompasses a group II–IV semiconductor device including a p-type group II–IV semiconductor containing zinc and selenium and the above ohmic metal electrode disposed on the group II–IV semiconductor device.

Alternatively, the present invention encompasses a group II–IV semiconductor device including a p-type group II–IV semiconductor containing zinc and selenium, a layer of a group II element other than zinc disposed on the group II–VI semiconductor device, and a metal electrode layer disposed on the layer of the group II element other than zinc is disclosed.

DETAILED DESCRIPTION OF THE PREFERRED EMBODIMENTS

Figure 1:
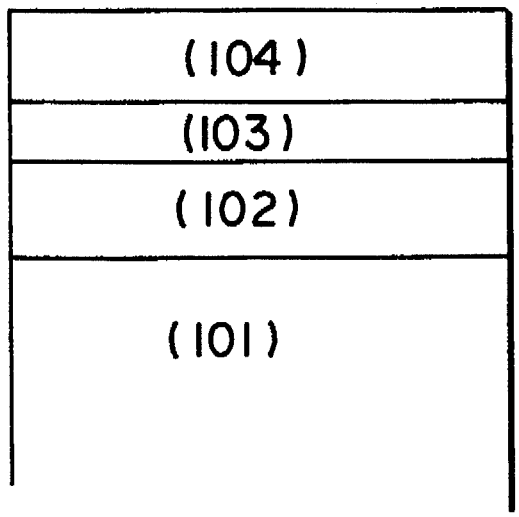
FIG. 1 illustrates a structure of an ohmic electrode for use with a semiconductor device according to the present invention.

A semiconductor device according to the present invention incorporates a p-type ohmic electrode suitable for a group II–IV semiconductor. Accordingly, any semiconductor device structure, i.e. an LED, LD or the like, can be used, and is not limited to a specific structure.

The layer adjacent to an electrode, that is, the layer upon which the electrode is formed, is made of a group II–IV compound, zinc selenide or a zinc selenide-group plural component p-type semiconductor (cited herein as simply a "zinc selenide layer"). Upon the zinc selenide layer 101 is formed a layer 102 in which a group II element other than zinc is diffused in a zinc selenide layer. A "group II element other than zinc" encompasses Be, Mg, Ca, Sr, Ba, Ra, Cd, and Hg.

Preferably, in this structure, the density of the group II element other than zinc in the layer 102 gradually increases from the side facing the zinc selenide layer 101 to the opposing side, facing the electrode. The density of the group II element other than zinc on the side facing the electrode is preferably higher than 1%, and is more preferably higher than 10%, and most preferably higher than 30%. In particular, it is preferred that the surface of the layer 102 facing the electrode is substantially composed of the group II element other than zinc. With this arrangement, the band gap gradually decreases toward the vicinity of the group II element other than zinc, and ultimately, ohmic contact with respect to the group II element other than zinc is established. Further, in a particularly preferable configuration, the surface is substantially defined by a layer containing a group II element other than zinc, and accordingly, satisfactory ohmic contact with another metal can be attained.

The method of diffusing a group II element other than zinc into the zinc selenide layer is not limited to a specific one, and any of usual methods can be used. According to one method, a layer made of the group II element other than zinc is formed on the zinc selenide layer, and the group II element other than zinc is diffused by heat treatment into the zinc selenide layer. An alternative process is a vapor deposition process, in which the partial pressure of a gas of the group II element other than zinc is varied. Also, molecular beam epitaxy (MBE) can be used.

The method in which a layer of the group II element other than zinc is formed on the zinc selenide layer and diffused by heat treatment is preferred when the structure in which the density of the group II element other than zinc gradually increases from the side facing the zinc selenide layer to the side facing the electrode is desired. Alternatively, with MBE or vapor deposition methods, the content of the group II element other than zinc to be introduced into the zinc selenide layer can be variably changed. Thus, the content of the group II element other than the zinc in zinc selenide layer can be changed as a linear function or can be changed as a variable function, e.g., its density can change as a step function.

Mercury, for example, can be used as the group II element other than zinc. However, because mercury is a liquid at the room temperature, it is readily evaporated. This fact not only causes problems during normal use of the ohmic electrode according to the present invention, but also causes serious problems when using heat for diffusing the group II element (i.e., the mercury) into the zinc selenide layer. A method which overcomes this problem employs a high melting point metal layer having a relatively high mechanical strength on the layer containing, as a main component, the group II element other than zinc, to restrain the group II element other than zinc from evaporating. Specifically, a metal having a melting point greater than 2,000°°C., such as platinum or tungsten, can be used. Because it is difficult to bond a metal wire or the like directly to platinum, tungsten or the like metal, another, cold layer is preferably formed on the high melting point metal layer.

Referring to FIG. 1, a specific arrangement of a semiconductor device according to the present invention will be explained as follows.

In FIG. 1, there are shown a p-type ZnSe layer 101, a layer 102 having Hg diffused in a p-type ZnSe and having a thickness of about 10 μnm to 1 m, a Pt layer 103 having a thickness of about 50 nm to 500 nm and an Au layer 104 having a thickness of about 100 nm to 2 μm.

Thus, according to the present invention, an ohmic electrode which is readily bonded can be formed on a group II–IV semiconductor including Zn Se and p-type ZnSe.

Crystal growth methods can be used to form a group II–IV layer containing a group II element other than zinc on a given p-type group II–IV compound before the p-type ohmic electrode is formed. Such group II elements other than zinc include HgSe (group II elements excluding zinc selenide), HgTe (group II elements excluding zinc telluride) or the like.

Figure 2:
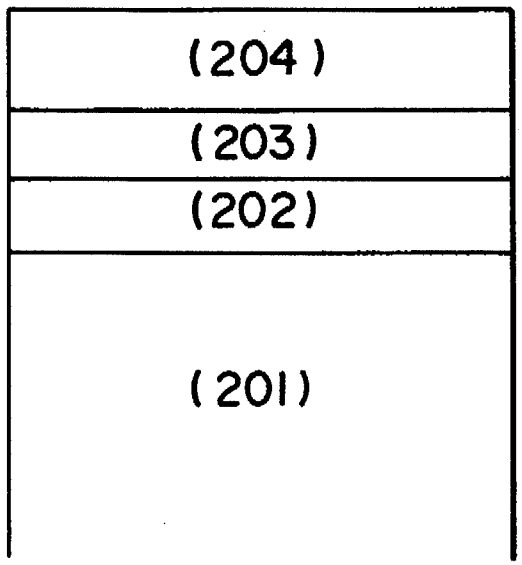
FIG. 2 illustrates one structure of a semiconductor device according to the present invention.

An example of the invention mentioned above is shown in FIG. 2 in which there are shown a p-type ZnSe layer 101, a p-type HgSe layer 202 as the group II element other than zinc having a thickness of about 10 to 100 nm, an HgTe layer 203 having a thickness of about 10 to 100 nm, and an Au electrode having a thickness of about 100 nm to 2 μm. Naturally, a method in which ZnSe in the HgSe layer is gradually changed into HgSe, that is, the change of x from 0 from 1 in the formula $Zn_xHg_{1-x}Se$ can be used. Similarly, a method in which the change of y from 0 to 1 in the formula $HgSe_yTe_{1-y}$ in the HgTe layer is also effective.

EXAMPLES.

The present invention will be illustrated by, but not limited to, the following examples.

Example 1

Figure 3:
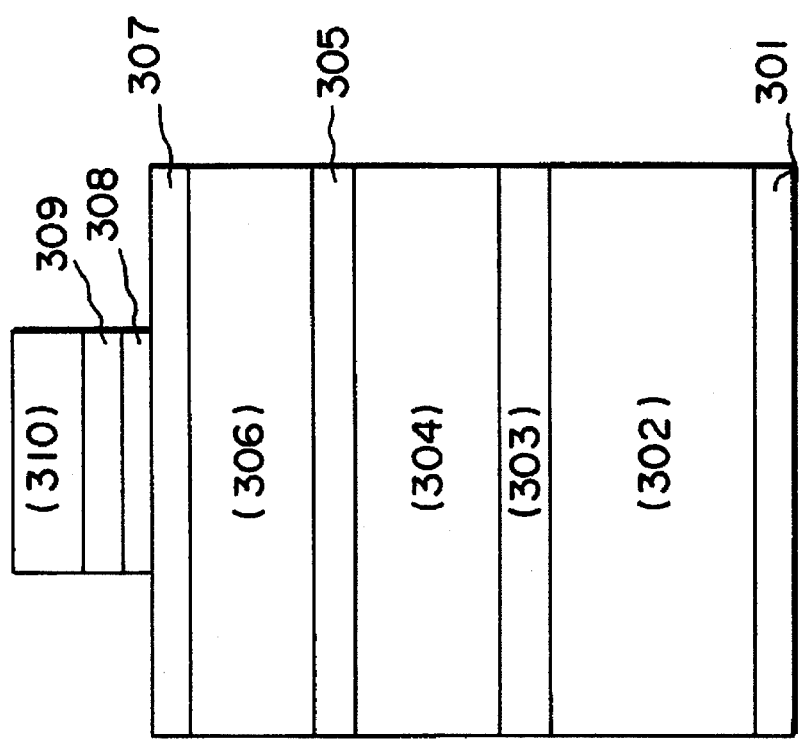
FIG. 3 illustrates another structure of a semiconductor device according to the present invention.

Referring to FIG. 3, an n-type ZnSe layer 303 doped with Cl having a thickness of 0.2 μm and a carrier density of $1\times10^{18}$ cm$^{-3}$; an n-type $ZnS_{0.07}Se_{0.93}$ layer 304 having a thickness of 1 μm and a carrier density of $1\times10^{17}$ cm$^{31\ 3}$; a p-type $Cd_{0.2}Zn_{0.8}Se$ layer 305 doped with nitrogen (N) having a thickness of 0.1 μm and a carrier density of $1\times10^{17}$ cm$^{-3}$; a p-type $ZnS_{0.07}Se_{0.93}$ layer 306 similarly doped with N having a carrier density of $3\times10^{17}$ cm$^{-3}$ and a p-type ZnSe layer 307 doped with N having a thickness of 0.2μ, where grown successively on an n-type GaAs substrate 302 by an MBE process at a growth temperature of 300° C. Thereafter, an In layer 301 as an n-type electrode was deposited by evaporation on the n-type GaAs substrate 302. An Hg layer 308 having a thickness of 30 nm, a Pt layer 309 having a thickness of 100 nm and an Au layer 310 having a thickness of 500 nm were deposited by evaporation to form a p-type electrode part on the p-type ZnSe 307 doped with N. Then the structure was heat treated for 10 minutes in a nitrogen atmosphere at a temperature of 280° C.

Next, the above LDs were energized by applying a voltage to them in a forward direction. The input current fed to the LED was 20 mA. Typically, a conventional structure in which Au alone is used for the p-type electrode required 15 V as an operational voltage. By contrast, the structure of this example of the present invention required only 3.3 V as the operational voltage.

Example 2

Figure 4:
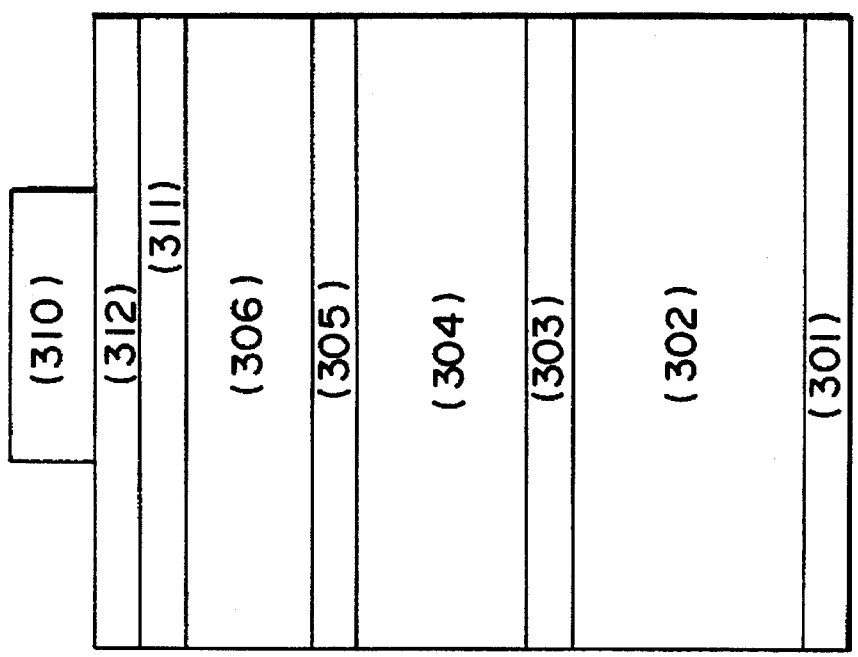
FIG. 4 illustrates yet another structure of a semiconductor device according to the present invention.

As shown in FIG. 4, a p-type HgSe layer 311 doped with N by an MBE process having a thickness of 50 nm, was formed by crystal growth on the structure 302–306 described in Example 1 obtained by the MBE process. Next, an In layer 301 as an n-type electrode was deposited by evaporation on the n-type GaAs substrate 302, and an Au layer 310 having a thickness of 500 nm as a p-type electrode was deposited on the HgTe layer 312 by evaporation and heat treated for 10 minutes in a nitrogen atmosphere at a temperature of 280° C.

Thereafter, a current of 20 mA was applied in the forward direction to the thus formed LED to energize it, as done in Example 1. The averaged operational voltage at that time was about 3.2 V.

Thus, according to the present invention, a p-type ohmic electrode suitable for a group II–IV semiconductor, and in particular, a semiconductor device suitable for blue LEDs, LDs or the like, which has not been available, can be obtained.

What is claimed is:

1. A group II–IV semiconductor device comprising:

a first layer of a p-type group II–IV semiconductor containing zinc and selenium;

a second layer of an ohmic electrode disposed on said first layer containing: (a) zinc and selenium, and (b) a group II element other than zinc; and a third layer of a metal electrode.

2. A group II–IV semiconductor device as claimed in claim 1, wherein a fourth layer of metal, having a melting point of at least 2000° C., is interposed between said second layer and said third layer.

3. A group II–IV semiconductor device as claimed in claim 1, wherein the group II element other than zinc is mercury.

4. A group II–IV semiconductor device as claimed in claim 1, wherein the zinc content of said second layer gradually increases from the side contacting said first layer to the side contacting said third layer.

\* \* \* \* \*

UNITED STATES PATENT AND TRADEMARK OFFICE
CERTIFICATE OF CORRECTION

PATENT NO. : 5,644,165
DATED : July 1, 1997
INVENTOR(S) : Hideki GOTO

It is certified that error appears in the above-indentified patent and that said Letters Patent is hereby corrected as shown below:

In the ABSTRACT, line 3, change "IV" to --VI--;
line 5, change "IV" to --VI--;
line 6, change "IV" to --VI--;
line 8, change "IV" to --VI--;
line 9, change "IV" to --VI--;
line 11, change "IV" to --VI--;
line 12, change "IV" to --VI--;
line 13, change "IV" to --VI--; and
line 15, change "IV" to --VI--.

In Column 1, lines 10, 12, 15, 22, 35, 41, 43, 44, 46, 47, 49, and 52, change "IV" to --VI-- (each occurrence).

In Column 2, lines 9 and 13, change "IV" to --VI-- (each occurrence).

In Column 3, lines 21, 22 and 24, change "IV" to --VI-- (each occurrence).

UNITED STATES PATENT AND TRADEMARK OFFICE
CERTIFICATE OF CORRECTION

PATENT NO. : 5,644,165
DATED : July 1, 1997
INVENTOR(S) : Hideki GOTO

It is certified that error appears in the above-indentified patent and that said Letters Patent is hereby corrected as shown below:

In Column 4, lines 33, 38, 39, 45, 49 and 52, change "IV" to --VI-- (each occurrence).

Signed and Sealed this

Twenty-eighth Day of October, 1997

Attest:

BRUCE LEHMAN

*Attesting Officer*    *Commissioner of Patents and Trademarks*